United States Patent
Terao

(10) Patent No.: US 12,140,876 B2
(45) Date of Patent: Nov. 12, 2024

(54) PROCESSING APPARATUS AND ARTICLE MANUFACTURING METHOD

(71) Applicant: CANON KABUSHIKI KAISHA, Tokyo (JP)

(72) Inventor: Tsutomu Terao, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 19 days.

(21) Appl. No.: 17/861,510

(22) Filed: Jul. 11, 2022

(65) Prior Publication Data

US 2023/0029254 A1    Jan. 26, 2023

(30) Foreign Application Priority Data

Jul. 16, 2021   (JP) .................................. 2021-118126

(51) Int. Cl.
   *G03F 7/00*   (2006.01)
(52) U.S. Cl.
   CPC .......... *G03F 7/709* (2013.01); *G03F 7/70725* (2013.01); *G03F 7/70883* (2013.01)
(58) Field of Classification Search
   CPC . G03F 7/709; G03F 7/70; G03F 7/708; G03F 7/70808; G03F 7/70816; G03F 7/70825; G03F 7/70833; G03F 7/70841; G03F 7/7085; G03F 7/70858; G03F 7/70975; G03F 7/70483–70541; G03F 7/70691–70791
   USPC .............................. 355/18, 30, 52–55, 67–77
   See application file for complete search history.

(56) References Cited

U.S. PATENT DOCUMENTS

| | | | | |
|---|---|---|---|---|
| 6,490,025 B1 * | 12/2002 | Makinouchi | ........ | G03F 7/70725 356/399 |
| 8,553,199 B2 * | 10/2013 | Butler | ..................... | G03F 7/709 355/53 |
| 2002/0080339 A1 * | 6/2002 | Takahashi | .............. | G03B 27/58 355/75 |

(Continued)

FOREIGN PATENT DOCUMENTS

| JP | 2001-140972 A | | 5/2001 |
|---|---|---|---|
| JP | 2004100953 A | * | 4/2004 |

OTHER PUBLICATIONS

English translation of JP2004-100953, published Apr. 2, 2004. (Year: 2004).*

(Continued)

*Primary Examiner* — Christina A Riddle
(74) *Attorney, Agent, or Firm* — Carter, DeLuca & Farrell LLP

(57) ABSTRACT

A processing apparatus includes a first structure supported by a vibration reduction mechanism, a drive mechanism supported by the first structure and configured to drive an object to be processed, a second structure supported by the first structure and facing the object, an actuator configured to apply a force to the first structure, a sensor configured to detect a vibration of the second structure, and a controller configured to feedforward-control the actuator based on feedforward control information so as to reduce vibrations of the first structure and the second structure. The feedforward control information includes first control information determined in advance based on an output from the sensor.

19 Claims, 7 Drawing Sheets

(56) References Cited

U.S. PATENT DOCUMENTS

| | | | |
|---|---|---|---|
| 2002/0104950 A1* | 8/2002 | Mayama | F16F 7/1005 |
| | | | 414/935 |
| 2006/0103944 A1* | 5/2006 | Ono | G03F 7/70833 |
| | | | 359/649 |
| 2008/0114473 A1* | 5/2008 | Heiland | G03F 7/709 |
| | | | 700/44 |

OTHER PUBLICATIONS

TW Office Action issued in corresponding TW Patent Application No. 111125295, dated Aug. 28, 2024, pp. 1-24, with English translation.

\* cited by examiner

FIG. 1
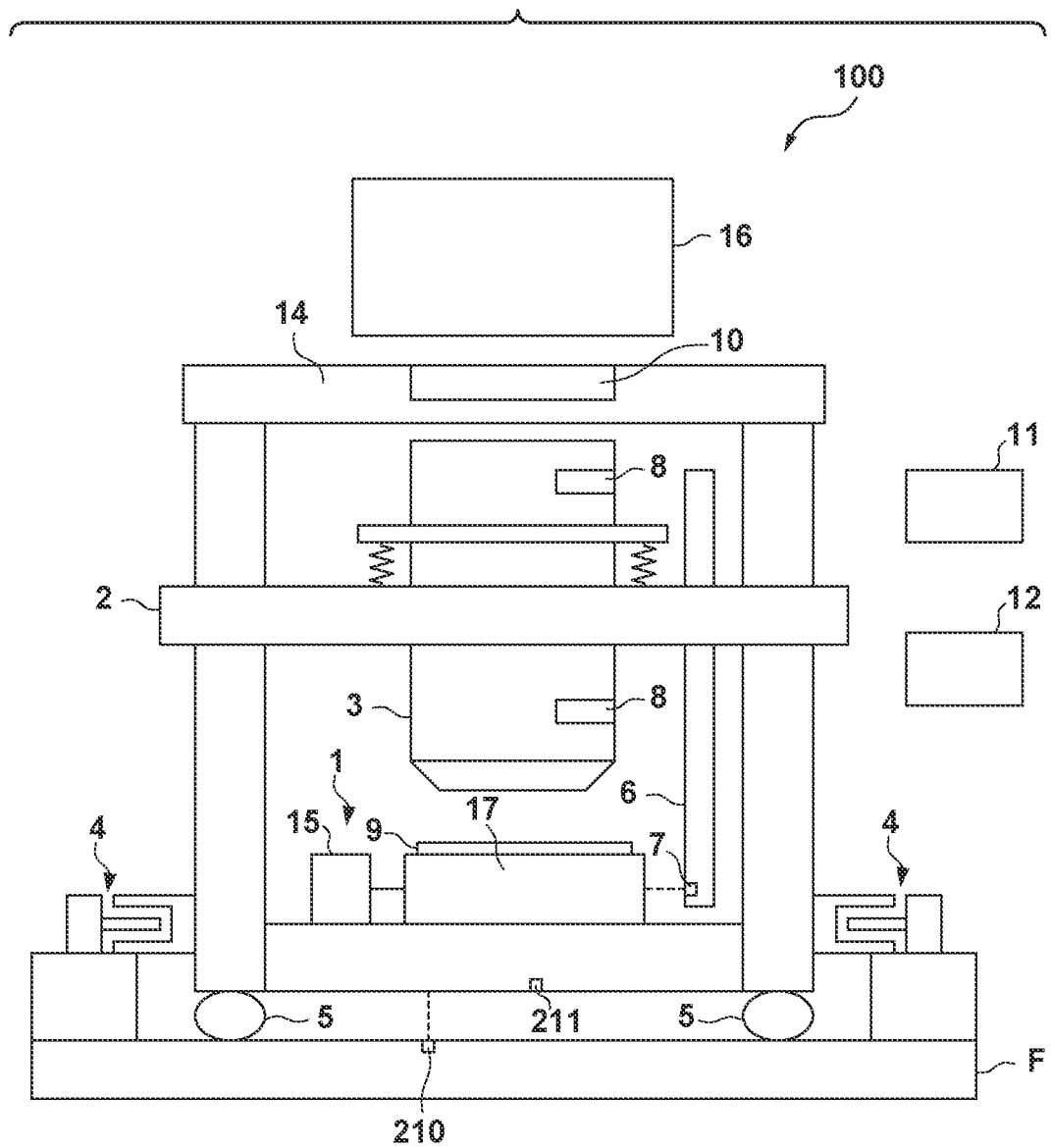
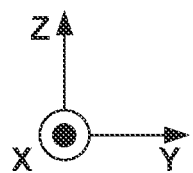

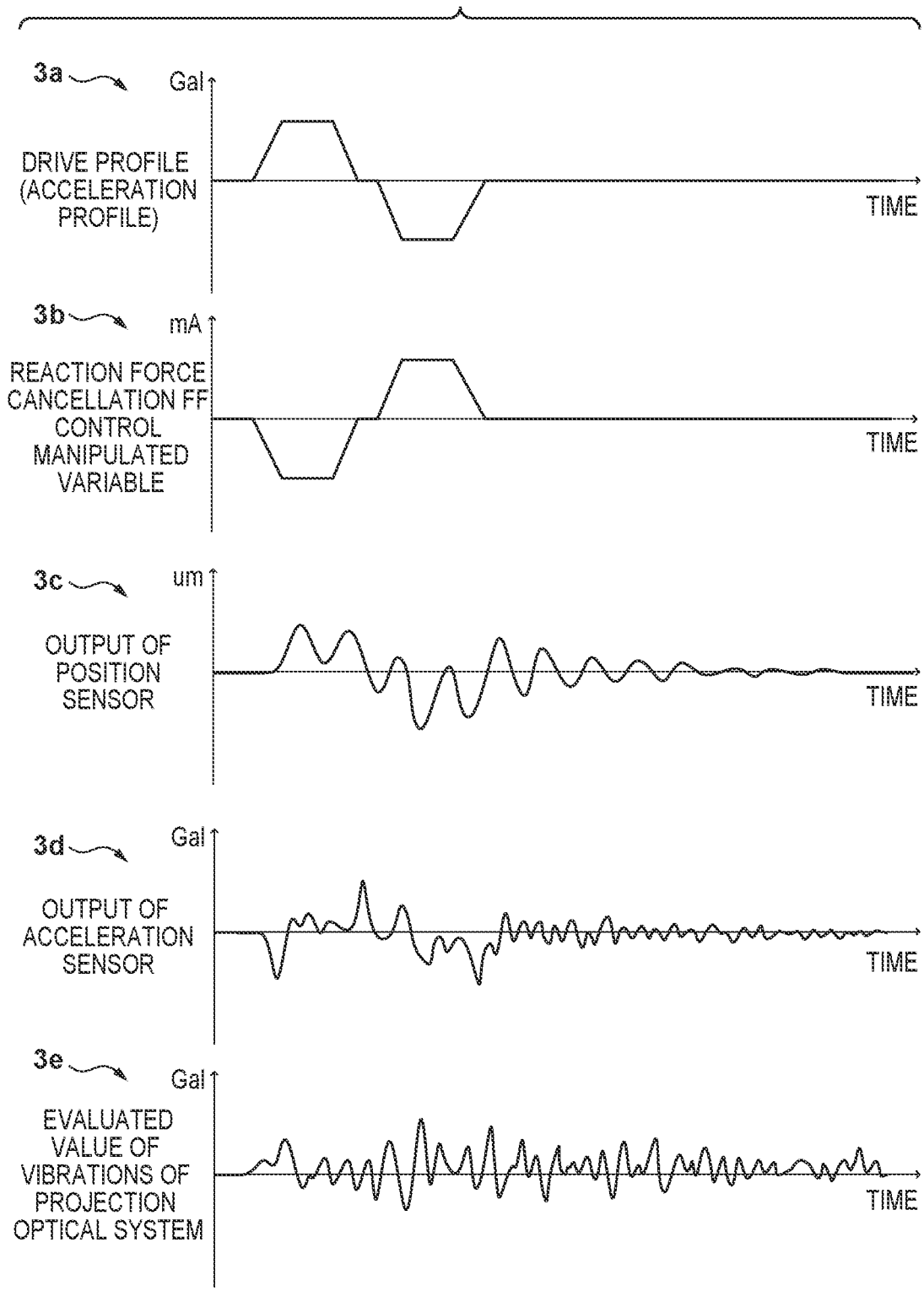

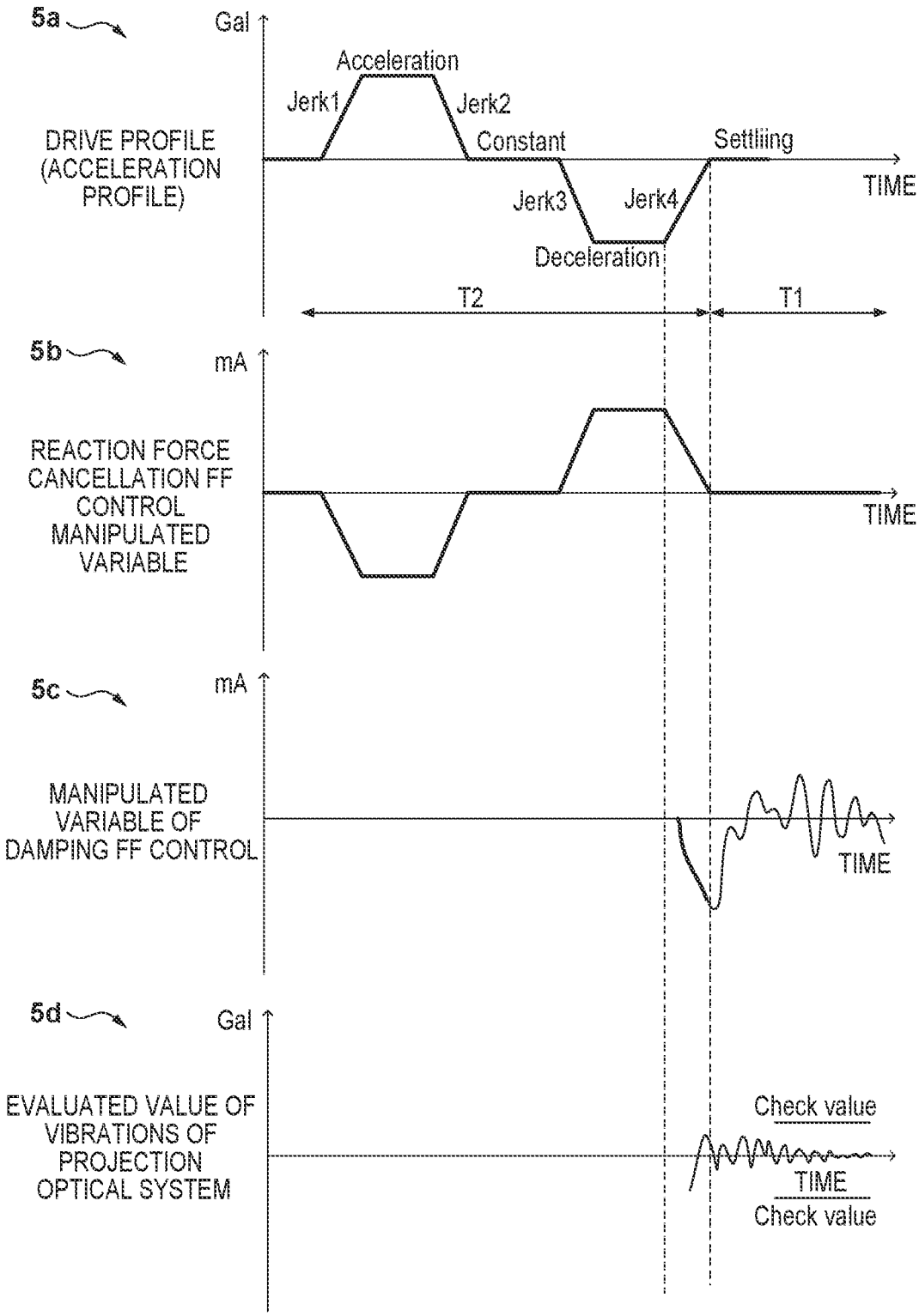

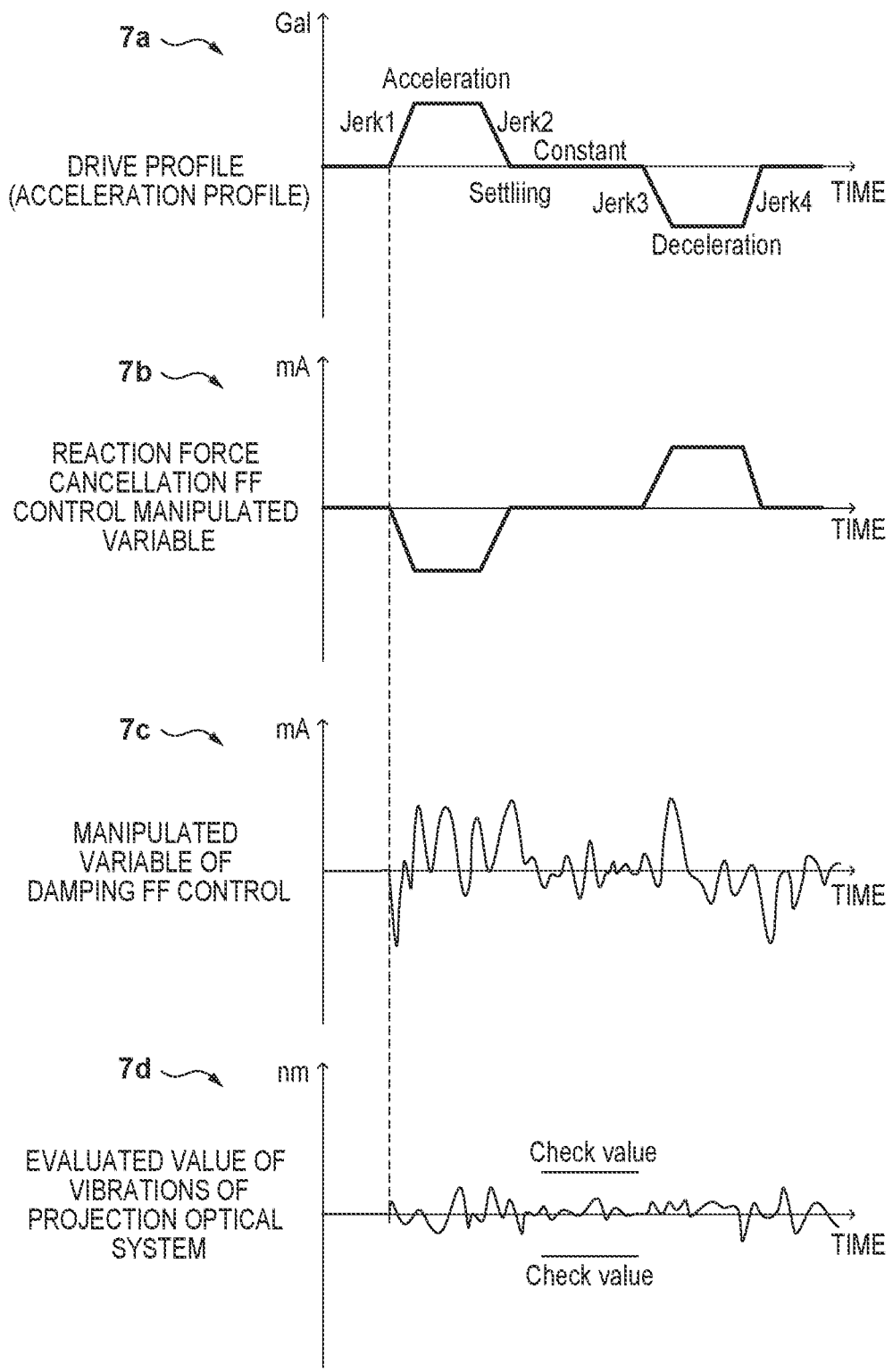

PROCESSING APPARATUS AND ARTICLE MANUFACTURING METHOD

BACKGROUND OF THE INVENTION

Field of the Invention

The present invention relates to a processing apparatus and an article manufacturing method.

Description of the Related Art

The performance to suppress vibrations is important for a processing apparatus including a drive mechanism for driving an object to be processed. For example, an exposure apparatus that forms or transfers a pattern onto a substrate is required to improve the throughput, overlay accuracy, and CD uniformity and also improve the damping performance of a support structure that supports a substrate drive mechanism, an original drive mechanism, a projection optical system, and the like.

Japanese Patent Laid-Open No. 2001-140972 discloses an anti-vibration device including an anti-vibration table, a stage that moves on the anti-vibration table, a plurality of actuators that drive the anti-vibration table, a plurality of displacement sensors that measure the position of the anti-vibration table, and a plurality of acceleration sensors that measure the vibrations of the anti-vibration table. In this anti-vibration device, the plurality of actuators are controlled to suppress the vibrations of the anti-vibration table based on outputs from the displacement sensors and the acceleration sensors. More specifically, an acceleration desired value for driving the stage is fed forward so as to cancel out the vibrations generated by the driving of the stage.

Although most of the vibrations caused by the reaction force accompanying the driving of the stage can be reduced by the feedforward control described above, vibrations can still remain. Such vibrations will be called residual vibrations. Residual vibrations can be suppressed by feedback control.

On the other hand, in order to improve the damping performance to damp vibrations from the floor to the support structure, feedback control can be targeted for a very low eigenfrequency. For this reason, a long time corresponding to a natural vibration period is required to suppress residual vibrations by feedback control. This can be a cause of affecting exposure accuracy such as overlay accuracy upon increasing the throughput.

Even if the positioning of the stage and a reduction in the vibrations of the support structure are implemented with high accuracy, the exposure accuracy is not always improved. One of the corresponding error factors is the vibrations of the projection optical system. Even if the projection optical system is fastened to the support structure with high rigidity, since the support structure and the projection optical system have different eigenvalues, they vibrate with different frequencies. It is important for the exposure apparatus to suppress the vibrations of the support structure. However, suppressing the vibrations of the projection optical system during exposure is more effective to improve the exposure accuracy. In this case, the support structure can be understood as an example of the first structure that receives a reaction force generated by the driving of an object to be processed. In addition, the projection optical system can be understood as an example of the second structure supported by the first structure.

SUMMARY OF THE INVENTION

The present invention provides a technique advantageous in reducing the vibrations of the second structure supported by the first structure.

One of aspects of the present invention provides a processing apparatus comprising: a first structure supported by a vibration reduction mechanism; a drive mechanism supported by the first structure and configured to drive an object to be processed; a second structure supported by the first structure and facing the object; an actuator configured to apply a force to the first structure; a sensor configured to detect a vibration of the second structure; and a controller configured to feedforward-control the actuator based on feedforward control information so as to reduce vibrations of the first structure and the second structure, wherein the feedforward control information includes first control information determined in advance based on an output from the sensor.

Further features of the present invention will become apparent from the following description of exemplary embodiments with reference to the attached drawings.

BRIEF DESCRIPTION OF THE DRAWINGS

FIG. 1 is a view exemplarily showing the arrangement of an exposure apparatus according to the first embodiment;

FIG. 3 is a view exemplarily showing an operation when no damping FF control is performed;

FIG. 5 is a view exemplarily showing operations when damping FF control and reaction force cancellation FF control are performed in accordance with the first embodiment;

FIG. 7 is a view exemplarily showing operations when damping FF control and reaction force cancellation FF control are performed in accordance with the second embodiment.

DESCRIPTION OF THE EMBODIMENTS

Figure 2:
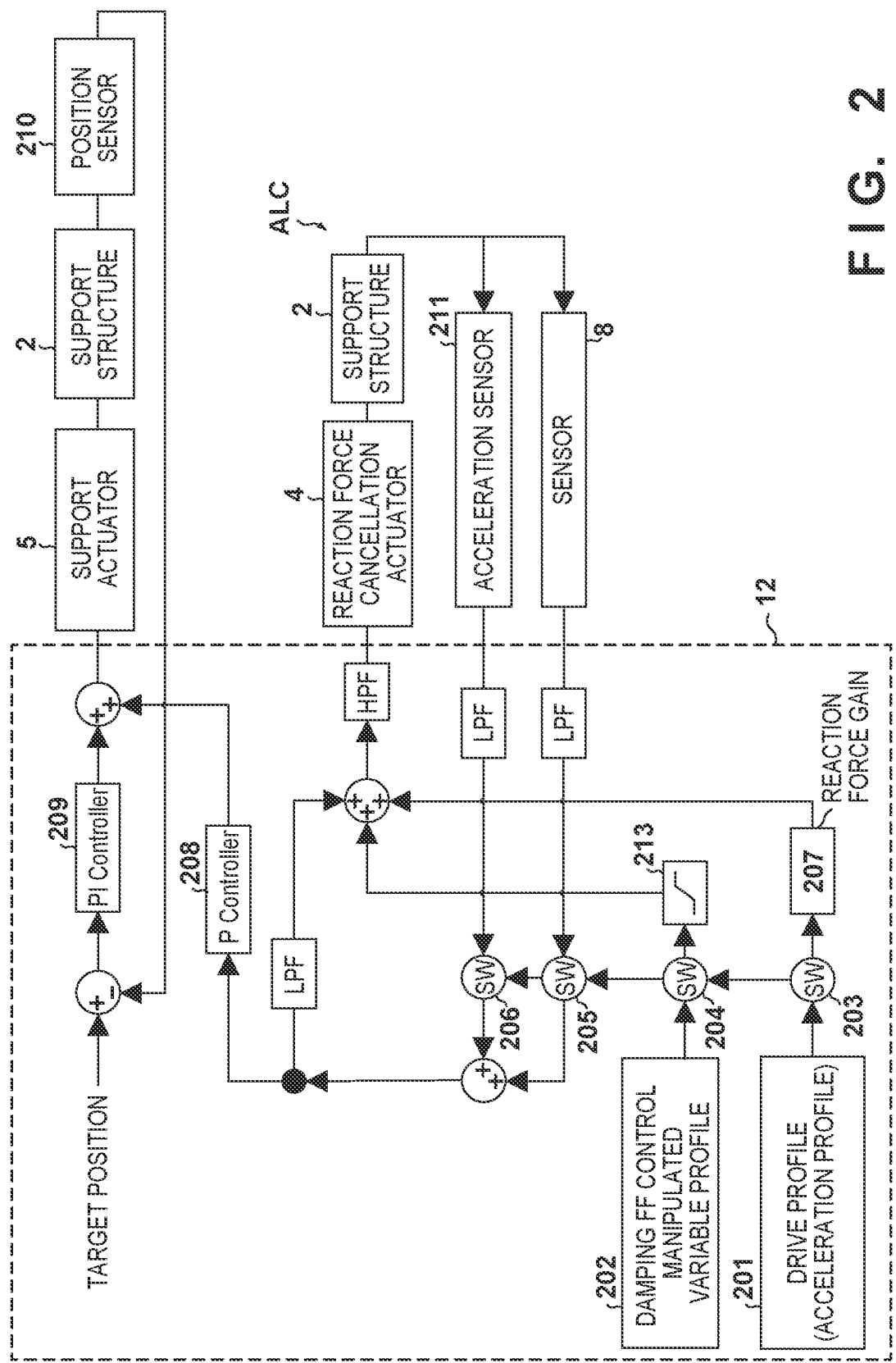
FIG. 2 is a control block diagram associated with control of a reaction force cancellation actuator and a support actuator in the exposure apparatus according to the first embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

The following embodiments each will describe, as an example of a processing apparatus according to the present invention, an exposure apparatus that can also be understood as a lithography apparatus, pattern forming apparatus, or transfer apparatus. However, the processing apparatus according to the present invention may be applied to other apparatuses, for example, a drawing apparatus, an inspection apparatus, a microscope apparatus, and a transfer apparatus.

FIG. 1 exemplarily shows the arrangement of an exposure apparatus 1000 according to the first embodiment. The exposure apparatus 100 can include a substrate positioning mechanism 1, a support structure 2, a projection optical system 3, a reaction force cancellation actuator 4, a support actuator 5, a measurement pillar 6, a measuring instrument 7, one or a plurality of sensors 8, a storage device 11, a controller 12, an original positioning mechanism 14, and an illumination optical system 16.

The support structure 2 is an example of the first structure and is supported on a floor F through the support actuator (for example, an air actuator) 5 as a vibration reduction mechanism. The support actuator 5 is configured to reduce vibrations transmitted from the floor F to the support structure 2. The support structure 2 can be configured to support the substrate positioning mechanism 1, the projection optical system 3, and the original positioning mechanism 14. The substrate positioning mechanism 1 can include a stage (holding unit) 17 that holds a substrate 9 as an object to be processed and a drive mechanism 15 that drives or positions the substrate 9 by driving the stage 17. The drive mechanism 15 can be configured to drive or position the substrate 9 relative to the X-axis, the Y-axis, the Z-axis, the Qx-axis, the Qy-axis, and the Qz-axis. The Qx-axis represents rotation about the X-axis, the Qy-axis represents rotation about the Y-axis, and the Qz-axis represents rotation about the Z-axis.

The projection optical system 3 is an example of the second structure that is supported by the support structure 2 (first structure) and faces the substrate 9 as an object to be processed. The projection optical system 3 can project the pattern of an original 10 held by the original positioning mechanism 14 onto the substrate 9 held by the stage 17 and expose the substrate 9. The substrate 9 is coated with a photoresist in advance. A latent image corresponding to the pattern of the original 10 can be formed on the photoresist by exposure. In other words, the pattern of the original 10 can be transferred onto the photoresist or the substrate 9 by exposure.

The reaction force cancellation actuator 4 can apply a force to the support structure 2 so as to cancel out or reduce the vibrations of the support structure 2 caused by the reaction force acting on the support structure 2 due to the driving of the stage 17 (substrate 9) by the drive mechanism 15 of the substrate positioning mechanism 1. The measurement pillar 6 supports the measuring instrument 7. The measurement pillar 6 can be supported by the support structure 2. The measuring instrument 7 can be configured to measure the position and posture of the stage 17. The measuring instrument 7 can include at least one of a laser interferometer and an encoder. The one or the plurality of sensors 8 can be arranged to detect information for detecting the vibrations of the projection optical system 3. The sensor 8 can be an acceleration sensor that can be attached to a predetermined place of the projection optical system 3 to detect an acceleration at the predetermined place.

The storage device 11 can store feedforward information (to be described later). The controller 12 can be implemented by a PLD (Programmable Logic Device) such as an FPGA (Field Programmable Gate Array), a general-purpose or dedicated computer incorporating an ASIC (Application Specific Integrated Circuit) or programs, or a combination of all or some of the above components. The original positioning mechanism 14 can be configured to hold and position the original 10. The illumination optical system 16 can be configured to illuminate the original 10 in a selected illumination mode so as to project the pattern of the original 10 onto the substrate 9 using the projection optical system 3. In addition, the exposure apparatus 100 can include a position sensor 210 that detects the position of the support structure 2 and an acceleration sensor 211 that detects the acceleration of the support structure 2.

The projection optical system 3 is typically constituted by an aggregate of large lenses. For this reason, even if the projection optical system 3 is fastened to the support structure 2 with high rigidity, the projection optical system 3 vibrates at a frequency different from that of the support structure 2. The vibrations of the projection optical system 3 change the relative position between the substrate 9 and the original 10. This can be a factor that decreases the pattern formation accuracy represented by CD uniformity (Critical Dimension Uniformity) and the overlay accuracy. The term "exposure accuracy" is used as a term that encompasses "pattern formation accuracy" and "overlay accuracy".

The deviation amount between the center of an amplitude, of the vibration components of the projection optical system 3, during exposure and the average value of the amplitudes affects the overlay accuracy, and the amplitude, of the amplitude components, during exposure affects the pattern formation accuracy such as CD uniformity. In order to satisfy both the exposure accuracy requirement and the throughput requirement, it is necessary to suppress the vibrations of the projection optical system 3 more quickly.

The main factor that causes the projection optical system 3 to vibrate is a reaction force acting on the support structure 2 when the drive mechanism 15 drives the stage 17. The reaction force cancellation actuator 4 is provided to cancel out or reduce the vibrations of the support structure 2 caused by this reaction force. The reaction force cancellation actuator 4 applies a force to the support structure 2.

FIG. 2 is a control block diagram associated with control of the reaction force cancellation actuator 4 and the support actuator 5 in the exposure apparatus 100. Referring to FIG. 2, "LPF" means a low-pass filter, and "HPF" means a high-pass filter. In addition, referring to FIG. 2, each circle including two or more "+" symbols means an adder, and the circle including the "+" and "−" symbols means a subtractor.

The controller 12 can calculate a reaction force that the drive mechanism 15 that drives the stage 17 exerts on the support structure 2 from a drive profile 201 as drive information (for example, information indicating shifts in moving direction, position, movement amount, velocity, and acceleration) for controlling the driving of the stage 17. The controller 12 can control the reaction force cancellation actuator 4 to exert a force to the support structure 2 in accordance with the timing of the occurrence of the reaction force in a period during which the drive mechanism 15 drives the stage 17. In this specification, this control is called "reaction force cancellation FF control". Reaction force cancellation FF control makes it possible to cancel out or reduce the vibrations of the support structure 2 caused by the reaction force generated by the driving of the stage 17 by the drive mechanism 15. Referring to FIG. 2, the drive profile 201 (acceleration profile) is provided to a reaction force gain multiplier 207 via a switch 203. The reaction force gain multiplier 207 multiples the drive profile 201 by a gain (a coefficient for calculating a reaction force) to generate a manipulated variable (reaction force cancellation FF control manipulated variable) supplied to the reaction force cancellation actuator 4.

When a switch 206 is ON, an acceleration feedback loop ALC for feedback control of the acceleration of the support structure 2 can be formed by supplying a manipulated variable to the reaction force cancellation actuator 4 based on an output from the acceleration sensor 211. In this case, the acceleration of the support structure 2 can be feedback-controlled so as to set the acceleration detected by the acceleration sensor 211 to 0. When a switch 205 is ON, an acceleration feedback loop for feedback control of the acceleration of the projection optical system 3 can be formed by supplying a manipulated variable to the reaction force cancellation actuator 4 based on one or a plurality of outputs from the one or the plurality of sensors 8. In this case, the acceleration of the support structure 2 can be feedback-controlled so as to set the acceleration of the projection optical system 3 detected by the one or the plurality of sensors 8 to 0.

In addition, the position of the support structure 2 can be controlled by a position feedback loop. More specifically, the position of the support structure 2 can be feedback-controlled so as to match an output from the position sensor 210 with a target position. More specifically, the position of the support structure 2 can be feedback-controlled by causing a compensator 209 to supply a manipulated variable corresponding to the deviation between the target position and the position of the support structure 2 detected by the position sensor 210 to the support actuator 5. The acceleration detected by the acceleration sensor 211 or the one or the plurality of sensors 8 may be supplied to a compensator 208 and the output from the compensator 208 may be added to an output from the compensator 209.

Referring to FIG. 3, 3a exemplarily shows the drive profile 201 (acceleration profile), and 3b exemplarily shows a reaction force cancellation FF control manipulated variable which is the manipulated variable obtained by multiplying the drive profile 201 (acceleration profiled) in 3a in FIG. 3 by the gain of the reaction force gain multiplier 207. The reaction force cancellation FF control manipulated variable is supplied to the reaction force cancellation actuator 4. In accordance with this manipulated variable, the reaction force cancellation actuator 4 exerts a force to the support structure 2. With this operation, although components of the vibrations of the support structure 2 which are in phase with the drive profile 201 (acceleration profile) are removed, some of the vibrations remain as residual vibrations, which can be transmitted to the projection optical system 3. Such residual vibrations can be reduced by feedback-controlling the support actuator 5 based on an output (see 3c in FIG. 3) from the position sensor 210 and feedback-controlling the reaction force cancellation actuator 4 based on an output (see 3d in FIG. 3) from the acceleration sensor 211. However, increasing the gain of such feedback control (servo control) will make it easier to transmit vibrations from the floor F to the support structure 2. For this reason, it is necessary to improve the vibration damping characteristic with respect to vibrations from the floor F to the support structure 2 by reducing the gain of the feedback control. Accordingly, as exemplarily shown in 3e in FIG. 3, a long time is required to reduce residual vibrations by feedback control.

In this embodiment, the controller 12 can feedforward-control the reaction force cancellation actuator 4 based on feedforward control information so as to reduce the vibrations of the support structure (first structure) 2 and the projection optical system (second structure) 3. Feedforward control information can include first control information determined in advance based on an output or outputs from the one or the plurality of sensors 8. The controller 12 can be configured to control the driving of the substrate (object to be processed) 9 or the stage 17 by the drive mechanism 15 based on predetermined drive information. The first control information can be information determined in advance based on an output or outputs from the one or the plurality of sensors 8 when the driving of the substrate 9 or the stage 17 is controlled by the drive mechanism 15 based on the drive information. The feedforward control information may further include second control information determined in advance so as to reduce the vibrations of the support structure 2 when the driving of the substrate 9 or the stage 17 is controlled by the drive mechanism 15 based on the drive information. The controller 12 can feedforward-control the reaction force cancellation actuator 4 in a first period based on the first control information and feedforward-control the reaction force cancellation actuator 4 in a second period based on the second control information. At least a part of the first period may start after the start of the second period and the end of the second period.

Figure 4A:
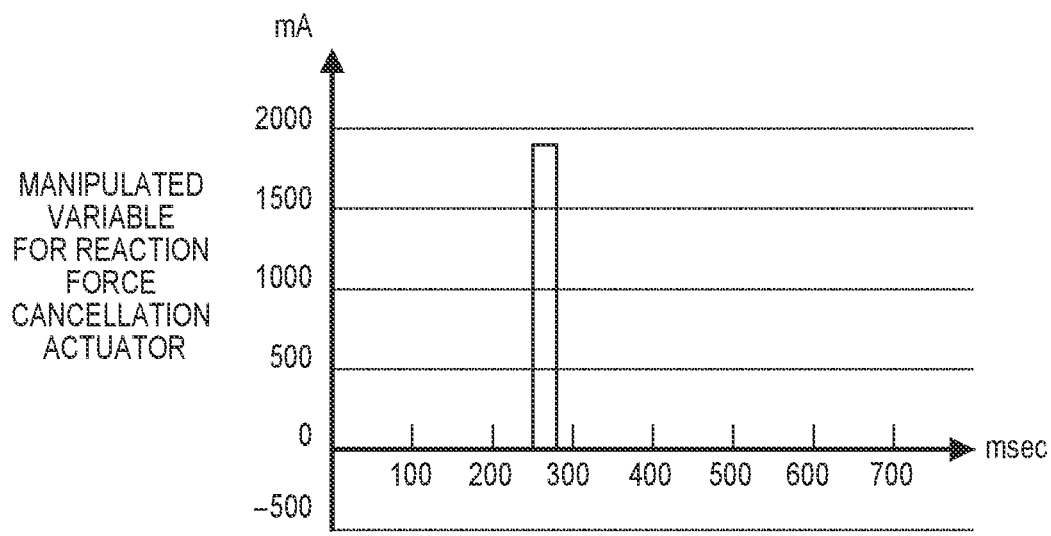
FIGS. 4A and 4B are views exemplarily showing impulse responses.
Figure 4B:
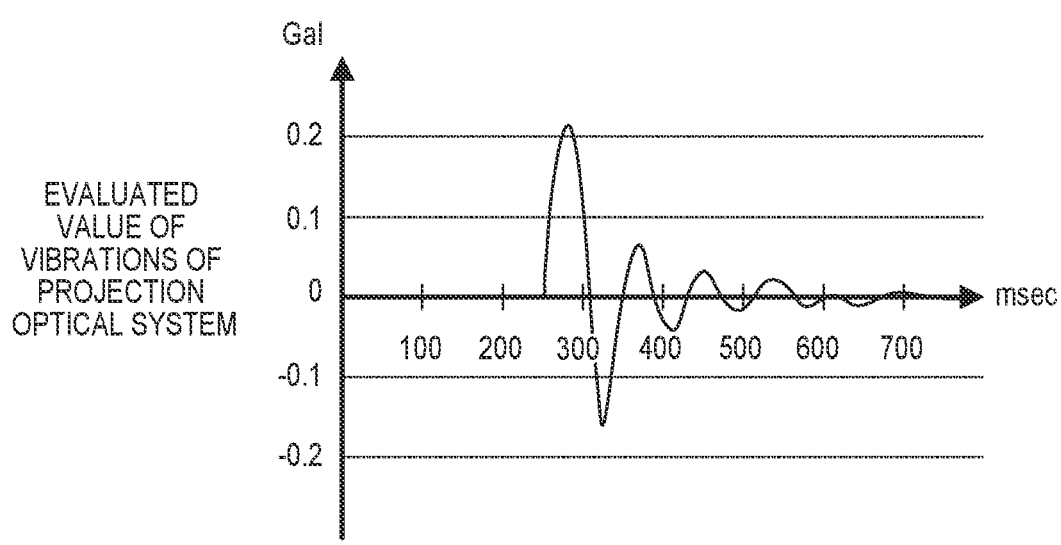

A method of deciding the second control information based on an output or outputs from the one or the plurality of sensors 8 when the driving of the substrate 9 or the stage 17 by the drive mechanism 15 is controlled based on drive information will be described below with reference to FIGS. 4A and 4B. The ordinate of FIG. 4A represents the manipulated variable supplied to the reaction force cancellation actuator 4, and the abscissa of FIG. 4A represents the time series. FIG. 4B shows the evaluated value (to be also referred to as the evaluated value of the projection optical system 3 or simply referred to as the evaluated value for the sake of convenience) obtained from an output or outputs from the one or the plurality of sensors 8 for the detection of the vibrations of the projection optical system 3. FIG. 4B shows the same time series as that of FIG. 4A. The controller 12 acquires, as an output response or output responses, an impulse response or impulse responses from the one or the plurality of sensors 8 when the impulse input (impulse input) exemplarily shown in FIG. 4A is supplied as the first manipulated variable to the reaction force cancellation actuator 4 while all the components stand still. FIG. 4B exemplarily shows such an output response (impulse response). The controller 12 or a computer (not shown) determines the second manipulated variable based on the relationship between the first manipulated variable and an output response. The second manipulated variable is the manipulated variable obtained by synthesizing (combining) coefficients that can differ at a plurality of times by multiplying them by the first manipulated variable. The controller 12 or the computer (not shown) predicts, as an output response, the evaluated value of the projection optical system 3 which can be obtained when the second manipulated variable is supplied to the reaction force cancellation actuator 4, based on the assumption that the first manipulated variable and the output response change in linear function. The second manipulated variable is determined by performing an approximate calculation for adjusting the coefficients in the respective time series such that the difference between the predicted output response and the target response falls within an allowable range (preferably, becomes 0).

The target response is the time-series evaluated value of the projection optical system 3 while feedforward control and reaction force cancellation FF control are executed and the stage 17 is driven in accordance with the drive profile. The period of the target response to be considered can include a period from a time immediately before the driving of the stage 17 to a time till the driving of the stage 17 is finished and the position and acceleration of the support actuator 5 and the evaluated value of the projection optical system 3 are settled. The controller 12 or the computer (not shown) can determine the first control information based on the second manipulated variable determined in this manner. That is, the controller 12 or the computer (not shown) can predict a shift or shifts in an evaluated value or evaluated values output from the one or the plurality of sensors 8 when the drive mechanism 15 is operated in accordance with the drive information, based on an impulse response, and determine the first control information based on the shift or shifts.

More specifically, the controller 12 or the computer (not shown) acquires a response e(t) to the evaluated value of the projection optical system 3 by using the one or the plurality of sensors 8 while no feedforward manipulated variable is supplied to the reaction force cancellation actuator 4. The controller 12 or the computer (not shown) extracts the evaluated value e(t) in an evaluation period including a period in which exposure processing is performed from the evaluated value e(t) of the projection optical system 3 as evaluated value data e0. In this case, assume that the evaluated value data e0 corresponds to 90 samples $e_1$ to $e_{90}$ and given by equation (1).

$$e_0 = [e_1 e_2 \ldots e_{90}]^T \quad (1)$$

The controller 12 or the computer (not shown) supplies a feedforward manipulated variable of $\Delta f(t)$ to the reaction force cancellation actuator 4 at a given time and acquires the corresponding response $\Delta y(t)$ by using the one or the plurality of sensors 8, as shown in FIGS. 4A and 4B. The controller 12 or the computer (not shown) then extracts, as response data y0, the evaluated value $\Delta y(t)$ in an evaluation period including a period in which exposure processing is performed from the evaluated value $\Delta y(t)$ of the projection optical system 3. In this case, the response data y0 is expressed as equation (2).

$$y_0 = [y_{1,0} y_{2,0} \ldots y_{90,0}]^T \quad (2)$$

The data so far are the values obtained by using the one or the plurality of sensors 8, that is, measured values. However, from now on, virtual data are generated. Assume that when, one sample after supplying a feedforward manipulated variable of $\Delta f(t)$ to the reaction force cancellation actuator 4, the same feedforward manipulated variable is supplied to the reaction force cancellation actuator 4, the same response is obtained. In this case, the response is represented by y1. Likewise, assuming that a response after two samples, a response after three samples, . . . , a response after n samples are respectively represented by y2, y3, . . . , yn, equation (3) holds.

$$[y_0 \; y_1 \; \ldots \; y_n] = \begin{bmatrix} y_{1,0} & y_{1,1} & \cdots & y_{1,n} \\ y_{2,0} & y_{2,1} & \cdots & y_{2,n} \\ \vdots & \vdots & \ddots & \vdots \\ y_{90,0} & y_{90,1} & \cdots & y_{90,n} \end{bmatrix} \quad (3)$$

If a linear function is established between the manipulated variable PGP-21E supplied to the reaction force cancellation actuator 4 and the evaluated value of the projection optical system 3, a response to a feedforward manipulated variable $g\Delta f(t)$ is represented by $g\Delta y(t)$. Therefore, letting gn be the gain of a feedforward manipulated variable after n samples, equation (4) holds.

$$[g_0 y_0 g_1 y_1 \ldots g_n y_n] = \begin{bmatrix} g_0 y_{1,0} + g_1 y_{1,1} + \cdots g_n y_{1,n} \\ g_0 y_{2,0} + g_1 y_{2,1} + \cdots g_n y_{2,n} \\ \vdots \\ g_0 y_{90,0} + g_1 y_{90,1} + \cdots g_n y_{90,n} \end{bmatrix} \quad (4)$$

A response to the evaluated value of the projection optical system 3 is then estimated, when all the feedforward manipulated variable after n samples is supplied to the reaction force cancellation actuator 4. Let Y be response data extracted from this response in an evaluation period including a period in which exposure processing is performed. Since Y can be expressed by the sum of n responses, equation (5) holds.

$$Y = \begin{bmatrix} Y_1 \\ Y_2 \\ \vdots \\ Y_{90} \end{bmatrix} = \quad (5)$$

$$\begin{bmatrix} g_0 y_{1,0} + g_1 y_{1,1} + \cdots g_n y_{1,n} \\ g_0 y_{2,0} + g_1 y_{2,1} + \cdots g_n y_{2,n} \\ \vdots \\ g_0 y_{90,0} + g_1 y_{90,1} + \cdots g_n y_{90,n} \end{bmatrix} = \begin{bmatrix} y_{1,0} + y_{1,1} + \cdots y_{1,n} \\ y_{2,0} + y_{2,1} + \cdots y_{2,n} \\ \vdots \\ y_{90,0} + y_{90,1} + \cdots y_{90,n} \end{bmatrix} \begin{bmatrix} g_0 \\ g_1 \\ \vdots \\ g_n \end{bmatrix}$$

In order to cancel out the evaluated value (e0) of the projection optical system in an evaluation period including a period in which exposure processing is performed by supplying a feedforward manipulated variable to the reaction force cancellation actuator 4, it is at least required to make the response data Y be equal to the evaluated value data e0 of the projection optical system 3. Therefore, a gain $g_n$ of a feedforward manipulated variable can be determined by using a pseudo inverse matrix like equation (6).

$$e_0 = Y \quad (6)$$

$$\begin{bmatrix} e_0 \\ e_1 \\ \vdots \\ e_{90} \end{bmatrix} = \begin{bmatrix} y_{1,0} + y_{1,1} + \cdots y_{1,n} \\ y_{2,0} + y_{2,1} + \cdots y_{2,n} \\ \vdots \\ y_{90,0} + y_{90,1} + \cdots y_{90,n} \end{bmatrix} \begin{bmatrix} g_0 \\ g_1 \\ \vdots \\ g_n \end{bmatrix}$$

$$\begin{bmatrix} g_0 \\ g_1 \\ \vdots \\ g_n \end{bmatrix} = \begin{bmatrix} y_{1,0} + y_{1,1} + \cdots y_{1,n} \\ y_{2,0} + y_{2,1} + \cdots y_{2,n} \\ \vdots \\ y_{90,0} + y_{90,1} + \cdots y_{90,n} \end{bmatrix} \begin{bmatrix} e_0 \\ e_1 \\ \vdots \\ e_{90} \end{bmatrix}$$

The controller 12 supplies a feedforward manipulated variable determined in accordance with the gain $g_n$ (that is, a feedforward manipulated variable $g_n \Delta f(t+t_n)$ obtained by multiplying a feedforward manipulated variable ($\Delta f(t+t_n)$) by the gain $g_n$) to the reaction force cancellation actuator 4. In this case, the feedforward manipulated variable $g_n \Delta f(t+t_n)$ corresponds to the second manipulated variable. The controller 12 determines the first feedforward manipulated variable (first control information) based on the second manipulated variable so as to cancel out the evaluated value of the projection optical system 3. In this specification, feedforward control based on the first feedforward manipulated variable is called "damping FF control". Projection system damping FF control can reduce the vibrations of the projection optical system 3 after the driving of the stage 17 more quickly than feedforward control alone.

FIG. 5 exemplarily shows the execution periods of reaction force cancellation FF control and damping FF control. Referring to FIG. 5, 5a exemplarily shows the drive profile 201 (acceleration profile) of the stage 17 (substrate 9), and 5b exemplarily shows a reaction force cancellation FF control manipulated variable (second control information) as the manipulated variable obtained by multiplying the drive profile 201 (acceleration profile) in 5a in FIG. 5 by the gain of the reaction force gain multiplier 207. In this case, the reaction force generated by the driving of the stage 17 is determined by the acceleration and weight of the stage 17 which are supplied by the drive profile 201 indicated by 5a in FIG. 5, and a reaction force cancellation FF control manipulated variable is determined to cancel out the reaction force. Referring to FIG. 5, 5c exemplarily shows a damping FF control manipulated variable profile 202 (first control information). The two dotted lines in FIG. 5 represent the start timing of a Jerk 4 period in the drive profile and the end timing of the Jerk 4 period (that is, the drive end timing).

Damping FF control can be executed in a first period T1. Reaction force cancellation FF control can be executed in a second period T2. The second period T2 can be a period in which the substrate 9 (stage 17) is moved from the first position (for example, the position at which the center of a given shot region on the substrate 9 coincides with the optical axis of the support structure 2) to the second position (for example, the position at which the center of the next shot region on the substrate 9 coincides with the optical axis of the support structure 2). The first period T1 can include a period in which the position of the substrate 9 or the stage 17 is settled. In the first period T1, the projection optical system 3 (second structure) can irradiate the substrate 9 (object to be processed) with an energy. More specifically, in the first period T1, the projection optical system 3 (second structure) can irradiate the substrate 9 (object to be processed) with exposure light and expose the substrate 9.

In the case shown in FIG. 5, the start time of the first period T1 is the time coinciding with the end time of the second period T2 or the time immediately after the end time of the second period T2. Reaction force cancellation FF control is advantageous in reducing the vibrations of the support structure 2 by canceling out or reducing the reaction force generated by the driving of the stage 17. In contrast to this, damping FF control is feedforward control based on the first control information determined based on the evaluated value of the projection optical system 3, and hence is advantageous in reducing the vibrations of the projection optical system 3. In this case, simultaneously performing reaction force cancellation FF control and damping FF control during the driving of the stage 17 (a period in which the stage 17 is moved from the first position to the second position) will control the two control targets, namely, the support structure 2 and the projection optical system 3, using the same reaction force cancellation actuator 4. In this case, reaction force cancellation FF control and damping FF control may interfere with each other. Accordingly, it is preferable to prevent interference between reaction force cancellation FF control and damping FF control.

In the case shown in FIG. 2, the switch 203 can control the supply of a reaction force cancellation FF control manipulated variable (second control information) with respect to the reaction force cancellation actuator 4. The switch 203 is a switch arranged in a path for supplying the manipulated variable based on the second control information to the reaction force cancellation actuator 4. When the switch 203 is turned on, a reaction force cancellation FF control manipulated variable (second control information) is supplied to the reaction force cancellation actuator 4. When the switch 203 is turned off, the manipulated variable (second control information) of reaction force cancellation FF control is not supplied to the reaction force cancellation actuator 4.

A switch 204 can control the supply of the manipulated variable (first control information) of damping FF control to the reaction force cancellation actuator 4. The switch 204 is a switch arranged in a path for supplying the manipulated variable based on the first control information to the reaction force cancellation actuator 4. When the switch 204 is turned on, the manipulated variable (first control information) of damping FF control is supplied to the reaction force cancellation actuator 4. When the switch 204 is turned off, the manipulated variable (first control information) of damping FF control is not supplied to the reaction force cancellation actuator 4. A sensor to be used in an acceleration feedback loop is switched from the acceleration sensor 211 to the one or the plurality of sensors 8 in accordance with the switching timing from reaction force cancellation FF control to damping FF control. This operation is performed by controlling the switches 205 and 206.

For example, as exemplarily indicated by the thick line in (c) in FIG. 5, the first period T1 may be started in a period in the second period T2 in which the substrate 9 (object to be processed) is decelerated. In the case exemplarily indicated by the thick line in (c) in FIG. 5, the first period T1 starts in the Jerk 4 interval in the drive profile in (a) in FIG. 5, that is, in an interval in which the absolute value of the acceleration decreases. In such a case, as exemplarily shown in FIG. 2, a gain adjuster 213 may be provided. The gain adjuster 213 is configured to supply the product of the manipulated variable supplied from the damping FF control manipulated variable profile 202 and an adjustment gain to the reaction force cancellation actuator 4 and can gradually increase the adjustment gain in an initial stage in the first period T1. The adjustment gain can be set so as to rise in a slope. Such control smooths the shift from reaction force cancellation FF control to damping FF control and is advantageous in improving the damping effect. How much the start timing of the first period T1 is advanced with respect to the end timing of the second period may be settable using a parameter value.

The evaluated value of the projection optical system 3 which is used for damping FF control can be acquired based on outputs from acceleration sensors that detect accelerations in the X-axis, Y-axis, and Z-axis directions and are arranged as the plurality of sensors 8 at, for example, the upper end and the lower end of the projection optical system 3. More specifically, the center of the place where the projection optical system 3 is fixed to the support structure 2 is set as a fulcrum, and the translation values and tilt values (rotation amounts) of the six axes of the projection optical system 3, namely, the X-, Y-, Z-, Qx-, Qy-, and Qz-axes, may be obtained from the ratios between the distances from the fulcrum to the acceleration sensors at the upper end and the lower end. The value obtained by converting the vibrations into the translation shift of the pattern transferred onto the substrate 9 can be set as an evaluated value. Damping FF control can be executed so as to minimize the evaluated value. However, the vibrations of the projection optical system 3 are not limited to the vibration mode of rigid motion. The vibrations can be vibrations including deformation components. Accordingly, a calculation formula may be established so as to include a weighting parameter for output values from the plurality of acceleration sensors, and exposure processing may be performed while damping FF control is performed in accordance with the evaluated value obtained by changing the weighting parameter, thereby deciding a weighting parameter for the calculation of an evaluated value from a correlation with the exposure processing result. The suppression of an evaluated value by damping FF control using such a technique is advantageous in improving the exposure accuracy.

The controller 12 reacquires the response data of damping FF control in a reset sequence at the startup of the exposure apparatus. When the difference between the reacquired response data and the preceding response data exceeds a threshold range, the controller 12 may update the response data and may update the first control information accordingly.

Referring to FIG. 5, (d) exemplarily shows the evaluated value during damping FF control. The period corresponding the "Check Value" line is an exposure period in which exposure processing is executed, and the controller 12 can be configured to monitor the evaluated value in the exposure period. The controller 12 can be configured to reacquire response data when the evaluated value exceeds a threshold in an exposure period and update the first control information accordingly. In this case, the controller 12 may be configured to monitor the average value of evaluated values in the exposure period and the standard deviation of the evaluated values in the exposure period, reacquire response data when the average value and the standard deviation respectively exceed thresholds, and update the first control information in accordance with the reacquired data. The controller 12 can update the first control information accompanying the reacquisition of the response data based on, for example, the drive profile of the stage 17.

The eigenvalues of the projection optical system 3 can include an eigenvalue that causes damping FF control to diverge. A damping FF control manipulated variable may be generated by processing the first control information using a bandpass filter, first- and second-order low-pass filters, and a notch filter. This makes it possible to stabilize the damping FF control.

Assume that an acceleration sensor is used to measure the vibrations of the stage 17 during driving. In this case, using an acceleration sensor with high accuracy can exceed the detection range of the acceleration sensor w % ben the vibrations are large. In this case, proper feedforward control cannot be performed. In contrast, when an acceleration sensor having a wide detection range is used, the detection sensitivity decreases. In order to satisfy the detection sensitivity requirement and the detection range requirement, both an acceleration sensor having a wide detection range and an acceleration sensor having a narrow detection range may be used. However, this will increase the cost. Accordingly, only reaction force cancellation FF control may be performed without using any acceleration sensor during the driving of the stage 17. In this case, as an acceleration sensor used for damping FF control after the driving of the stage 17, an acceleration sensor having a narrow detection range but having a high detection sensitivity can be used. This can obtain a high damping effect and a high cost merit.

In the above case, the acceleration sensors are arranged at the upper end and the lower end of the projection optical system 3. However, acceleration sensors may be arranged at arbitrary positions on the upper and lower sides of the place where the projection optical system 3 is held by the support structure 2. Alternatively, an acceleration sensor may be arranged at only one of arbitrary positions on the upper and lower sides of the place where the projection optical system 3 is held by the support structure 2.

The first control information may be determined by, for example, simulation, trial and error, machine learning, or another method.

When the acceleration sensor attached to the projection optical system 3 is used as a sensor for detecting the vibrations of the projection optical system 3, the detection sensitivity can be increased by narrowing the detection range. In addition, an acceleration sensor can be arranged at an arbitrary position on the projection optical system 3. In contrast, when importance is placed on the relative position between a plurality of detection target positions, detecting a relative position with respect to the same reference using a position sensor sometimes produces a more advantageous effect.

Figure 6:
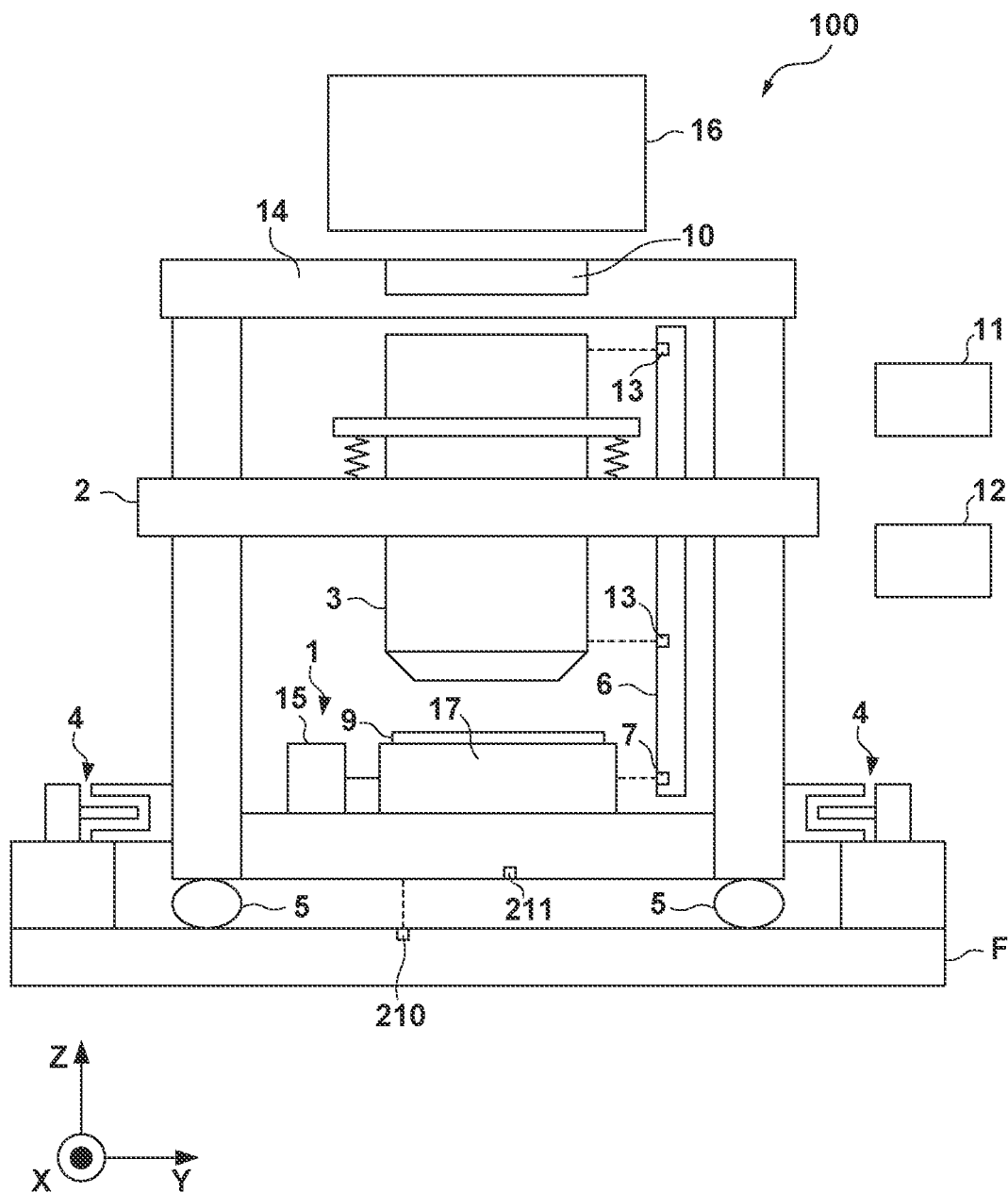
FIG. 6 is a diagram exemplarily showing the arrangement of an exposure apparatus according to the second embodiment.

FIG. 6 shows the arrangement of an exposure apparatus 100 according to the second embodiment. Matters that are not mentioned in the second embodiment can comply with the first embodiment. In the second embodiment, the position or positions of one or a plurality of portions of a projection optical system 3 can be detected by using one or a plurality of sensors 13. The one or the plurality of sensors 13 are, for example, a laser interferometer or laser interferometers. The one or the plurality of sensors 13 are used in place of the one or the plurality of sensors 8 in the first embodiment. The one or the plurality of sensors 13 and a measuring instrument 7 that measures the position of a stage 17 are supported by the same measurement pillar (reference structure) 6. The measuring instrument 7 is, for example, a laser interferometer. This arrangement makes it possible to obtain a correlation between the evaluated value for damping FF control and position control of the stage 17 (substrate 9). That is, reducing the evaluated value in damping FF control will contribute to a reduction in errors in the position control of the stage 17 (substrate 9) and improve the exposure accuracy.

In the first embodiment, the first period in which damping FF control is executed can start at the end time of the second period in which reaction force cancellation FF control is executed or immediately after that time or start at a time after the start of the second period and before the end of the second period. Alternatively, in the first embodiment, damping FF control can be started after reaction force cancellation FF control is weakened. In contrast, in the second embodiment, as exemplarily shown in FIG. 7, damping FF control can be started at the time of starting the driving of the stage 17. In this case, 7a in FIG. 7 exemplarily shows a drive profile 201 (acceleration profile) of the stage 17 (substrate 9). Referring to FIG. 7, 7b exemplarily shows the reaction force cancellation FF control manipulated variable (second control information) as the manipulated variable obtained by multiplying the drive profile 201 (acceleration profile) by the gain of a reaction force gain multiplier 207. Referring to FIG. 7, 7c exemplarily shows a damping FF control manipulated variable profile 202 (first control information). Referring to FIG. 7, 7d exemplarily shows the evaluated value in damping FF control. The dotted line in FIG. 7 indicates the start timing of the driving of the stage 17. In the second embodiment, reaction force cancellation FF control and damping FF control can be started from the start timing of the driving of the stage 17.

A controller 12 feedback-controls the stage 17 by operating a drive mechanism 15 based on an output from the measuring instrument 7 and also feedforward-controls a reaction force cancellation actuator 4 based on preset feedforward control information. Feedforward control is executed so as to reduce the vibrations of the support structure (first structure) 2 and the projection optical system (second structure) 3. Feedforward control information can include a first control information component and a second control information component. The first control information component is the first control information determined in advance to reduce the vibrations of the projection optical system (second structure) 3 generated by the driving of the stage 17 by the drive mechanism 15. The second control information component is the second control information determined in advance so as to reduce the vibrations of the support structure (first structure) 2 generated by the driving of the stage 17 by the drive mechanism 15.

In the second embodiment, the measuring instrument 7 for controlling the stage 17 and the one or the plurality of sensors 13 for detecting the vibrations of the projection optical system 3 are supported by the same measurement pillar 6 (reference structure). Therefore, reducing the evaluated value of the projection optical system 3 will contribute to a reduction in the vibrations of the projection optical system 3 relative to the stage 17. That is, the side effect of damping FF control in the second embodiment is smaller than in the first embodiment. In addition, using a laser interferometer as the sensor 13 can obtain high detection sensitivity in a wide detection range as compared with the case of using an acceleration sensor.

Higher damping performance can be obtained by adding residual vibrations which cannot be removed by damping FF control and reaction force cancellation FF control to the target value of the stage 17. The residual vibrations in this case can be the evaluated value converted into the position control error of a substrate 9. In control of the stage 17, unlike in vibration control of the support structure 2, increasing the control band will contribute to accuracy improvement. Accordingly, it is possible to make the stage 17 follow up the vibrations of the projection optical system 3 in a short time even by feedforward control with residual vibrations being added to the target value.

The first embodiment is suitable for a stepper that exposes a substrate upon making the substrate and an original stationary. The second embodiment is suitable for a scanner that scans and exposes a substrate in addition to a stepper. Although not essential, the scanner can perform scanning exposure in a constant-velocity interval after the acceleration of the stage. Such a scanner is required to sufficiently suppress the vibrations of the projection optical system in a settling interval in a constant-velocity interval. In this regard, the second embodiment is also advantageous in reducing the residual vibrations of the projection optical system over an acceleration interval and a constant-velocity interval because damping FF control and reaction force cancellation FF control need not be switched and both can be executed from the start of the driving of the stage.

As the sensor 13, in addition to a laser interferometer, a sensor of any type that can detect the position of the projection optical system 3 relative to a reference position can be used. In this case, for example, an eddy-current proximity displacement detector can be used.

An article manufacturing method of manufacturing an article (a semiconductor IC element, liquid crystal display element. MEMS, or the like) by using the above exposure apparatus will be exemplarily described. An article is manufactured by using the above exposure apparatus through an exposure step of exposing a substrate (a wafer, glass substrate, or the like) coated with a photosensitizing agent, a developing step of developing the substrate (photosensitizing agent), and a processing step of processing the substrate having undergone the developing step in other known steps. Other known steps include etching, resist removal, dicing, bonding, and packaging. This article manufacturing method can manufacture an article with higher quality than a conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-118126, filed Jul. 16, 2021, which is hereby incorporated by reference herein in its entirety.

What is claimed is:

1. A processing apparatus comprising:
   a first structure;
   a drive mechanism supported by the first structure and configured to drive an object to be processed;
   a second structure supported by the first structure and facing the object;
   an actuator configured to apply a force to the first structure;
   a sensor configured to detect a vibration of the second structure; and
   a controller configured to control driving of the object by the drive mechanism based on drive information and to feedforward-control the actuator based on feedforward control information so as to reduce vibrations of the first structure and the second structure,
   wherein the feedforward control information includes first control information determined in advance based on an output from the sensor when driving of the object is controlled by the drive mechanism based on the drive information,
   the feedforward control information further includes second control information determined in advance so as to reduce a vibration of the first structure when driving of the object is controlled by the drive mechanism based on the drive information,
   the controller feedforward-controls the actuator based on the first control information in a first period and feedforward-controls the actuator based on the second control information in a second period, and
   the first period is a period starting after a start of the second period.

2. The apparatus according to claim 1, wherein the second period is a period in which the object is moved from a first position to a second position.

3. The apparatus according to claim 1, wherein the first period includes a period in which a position of the object is settled.

4. The apparatus according to claim 1, wherein in the first period, the object is irradiated with energy from the second structure.

5. The apparatus according to claim 1, wherein a start time of the first period coincides with an end time of the second period or a time immediately after the end time.

6. The apparatus according to claim 1, wherein the first period starts after a start of the second period and after an end of the second period.

7. The apparatus according to claim 6, wherein the first period starts in a period of the second period in which the object is decelerated.

8. The apparatus according to claim 6, wherein the controller includes a multiplier configured to generate a manipulated variable supplied to the actuator by multiplying the first control information by a gain, and
   the gain gradually increases in the second period.

9. The apparatus according to claim 8, further comprising:
   a position sensor configured to detect a position of the first structure;
   a support actuator configured to support the first structure; and a compensator configured to control the support actuator so as to feedback-control the position of the first structure based on an output from the position sensor, wherein the first control information and the second control information are added to a manipulated variable of the support actuator.

10. The apparatus according to claim 1, further comprising:

an acceleration feedback loop configured to cause the first structure to feedback-control the actuator based on an output from an acceleration sensor that detects an acceleration of the first structure;

a first switch arranged in a path that supplies a manipulated variable based on the first control information to the actuator; and a second switch arranged in a path that supplies a manipulated variable based on the second control information to the actuator.

11. The apparatus according to claim 1, wherein the controller predicts a shift in an evaluated value of an output from the sensor when the drive mechanism is operated in accordance with the drive information based on an impulse response as an output from the sensor when an impulse input is supplied as a manipulated variable to the actuator and determines the first control information based on the shift.

12. The apparatus according to claim 1, wherein the controller determines or updates the first control information based on an evaluated value of an output from the sensor.

13. The apparatus according to claim 1, wherein the second structure includes a projection optical system configured to project a pattern of an Original onto a substrate as an object to be processed, and the sensor includes an acceleration sensor for detecting a vibration of the projection optical system.

14. An article manufacturing method of manufacturing an article, the method comprising:

causing a processing apparatus according to claim 13 to expose a substrate;

developing the substrate having undergone the exposing; and obtaining the object by processing the substrate having undergone the developing.

15. The apparatus according to claim 1, wherein the first structure is supported by a vibration reduction mechanism.

16. A processing apparatus for processing an object, comprising:

a first structure;

a drive mechanism supported by the first structure and configured to drive the object;

a second structure supported by the first structure and facing the object;

an actuator configured to apply a force to the first structure; and a controller configured to control driving of the object by the drive mechanism based on drive information and to feedforward-control the actuator based on feedforward control information so as to reduce vibrations of the first structure and the second structure, wherein the feedforward control information includes first control information and the controller is further configured to obtain the first control information, before performing the processing of the object, based on an evaluated vibration of the second structure when driving of the object is controlled by the drive mechanism based on the drive information, the feedforward control information further includes second control information determined in advance so as to reduce a vibration of the first structure when driving of the object is controlled by the drive mechanism based on the drive information, the controller feedforward-controls the actuator based on the first control information in a first period and feedforward-controls the actuator based on the second control information in a second period, and the first period is a period starting after a start of the second period.

17. The apparatus according to claim 16, wherein the second structure includes a projection optical system configured to project a pattern of an Original onto a substrate as an object to be processed, and the apparatus further comprises one or a plurality of acceleration sensors configured to detect a vibration of the projection optical system.

18. An article manufacturing method of manufacturing an article, the method comprising:

causing a processing apparatus according to claim 17 to expose a substrate;

developing the substrate having undergone the exposing; and obtaining the object by processing the substrate having undergone the developing.

19. The apparatus according to claim 16, wherein the first structure is supported by a vibration reduction mechanism.

* * * * *